United States Patent [19]

Busby

[11] Patent Number: 4,775,985

[45] Date of Patent: Oct. 4, 1988

[54] METHOD OF DC-FREE 8/9 NRZ CODING USING A UNIQUE SYNC WORD PATTERN

[75] Inventor: Bruce E. Busby, Sunnyvale, Calif.

[73] Assignee: Sony Corporation, Tokyo, Japan

[21] Appl. No.: 34,849

[22] Filed: Apr. 6, 1987

[51] Int. Cl.⁴ ............................................ H04B 14/04
[52] U.S. Cl. ........................................ 375/25; 360/40; 375/106; 341/95
[58] Field of Search ...................... 375/18, 19, 25, 106, 375/111, 114, 20; 371/56, 47; 340/347 DD; 360/39–44

[56] References Cited

U.S. PATENT DOCUMENTS

| | | | |
|---|---|---|---|
| 4,027,335 | 5/1977 | Miller | 375/19 |
| 4,364,081 | 12/1982 | Hashimoto et al. | 358/13 |
| 4,499,454 | 2/1985 | Shimada | 360/40 |
| 4,501,000 | 2/1985 | Immink et al. | 375/25 |
| 4,517,552 | 5/1985 | Shirota et al. | 340/347 DD |
| 4,520,346 | 5/1985 | Shimada | 360/40 |
| 4,531,153 | 7/1985 | Watanabe | 358/141 |
| 4,547,890 | 10/1985 | Gindi | 375/19 |
| 4,577,180 | 3/1986 | Fukuda | 340/347 DD |
| 4,620,311 | 10/1986 | Schouhamer Immink | 375/19 |
| 4,626,826 | 12/1986 | Fukuda et al. | 358/261 |
| 4,698,809 | 10/1987 | Munter | 340/347 DD |

OTHER PUBLICATIONS

Article Entitled 8-9 Block Code a DC-Free Channel Code for Digital Magnetic Recording, by Hirofumi Yoshida, Toshiyuki Shimada, and Yoshitaka Hshimoto. in SMPTE Journal, Sep. 1983.

Duc, "Line Coding Techniques for Baseband Digital Transmission", ATR, vol. 9, No. 1, 1975.

*Primary Examiner*—Benedict V. Safourek
*Assistant Examiner*—Stephen Chin
*Attorney, Agent, or Firm*—Philip M. Shaw, Jr.

[57] ABSTRACT

An 8/9 encoding scheme wherein the improvement comprises selectively outputting, in response to a sync control signal, a first and a second 9 bit code word that uniquely identify a synchronization point in the 9 bit data word stream. The first code word is 1 1111 1111$_2$ (1FF$_{16}$) if the digital sum variation (DVS) is less than zero and 0 0000 0000$_2$ (000$_{16}$) if the digital sum variation is greater than or equal to zero. The second code word is any ±1 CDS entry of the same CDS polarity as the first word. In a preferred embodiment of the invention, the second code word is 1 0101 0101$_2$ or 155$_{16}$ (CDS = +1) or 0 1010 1010$_2$ or 0AA$_{16}$ (CDS = −1).

10 Claims, 1 Drawing Sheet

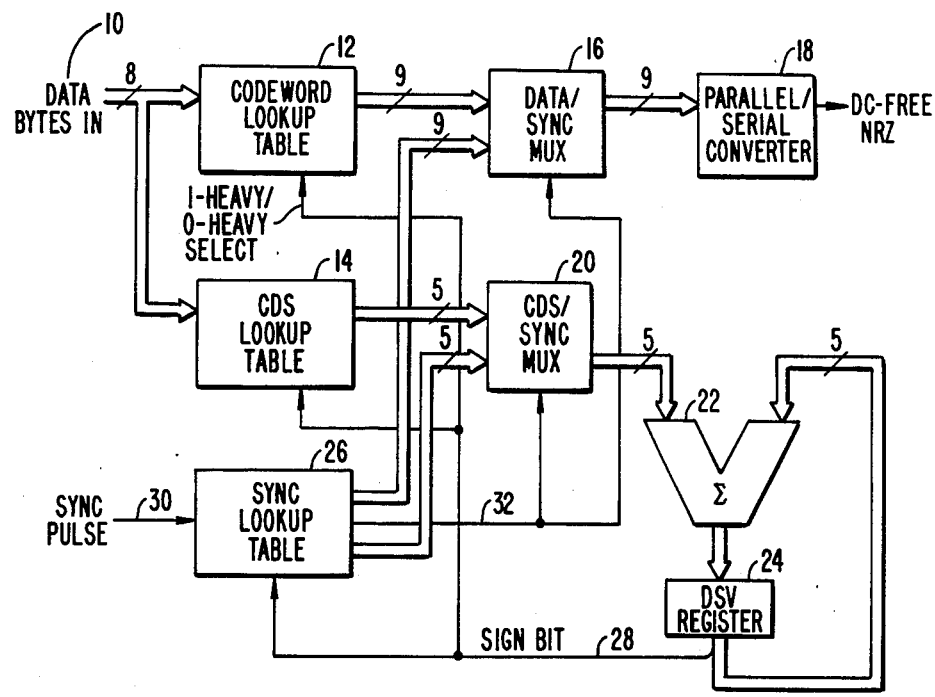
FIG.—1.
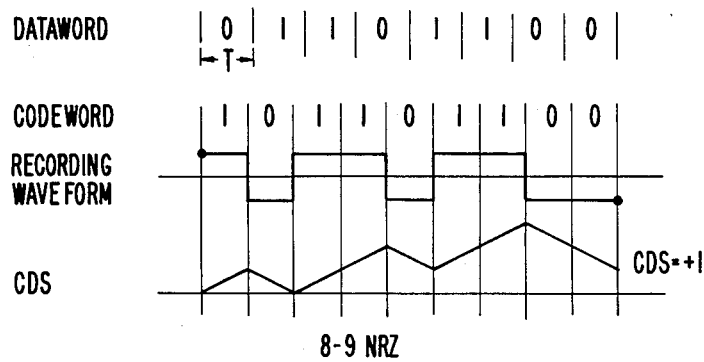
FIG.—2.

METHOD OF DC-FREE 8/9 NRZ CODING USING A UNIQUE SYNC WORD PATTERN

TECHNICAL FIELD

This invention relates to 8/9 block coding in digital magnetic recording and more particularly to the use of a unique sync word in such coding.

BACKGROUND ART

Channel coding is generally employed in digital magnetic recording to match certain properties of the coded sequence to the channel characteristics of the recorder. Since magnetic recorders are incapable of reproducing very low frequencies or direct current (dc) content, dc-free channel codings, such as 8/10 block code, modified Miller code ($M^2$), interleaved NRZI, and tri-level code, have primarily been employed in digital video tape recorders (VTRs).

A new dc-free channel code for digital magnetic recording was reported by Hirofumi Yoshida, Toshiyuki Shimada, and Yoshitaka Hashimoto in an article entitled "8-9 *Block Code, A DC-Free Channel Code for Digital Magnetic Recording*," in the Sept. 1983 issue of the *SMPTE Journal*, pp. 918-922. In this article, the authors point out that channel coding methods are considered to be the combination of two processes. First is the transformation of m-bit data words to n-bit code words which are concatenated to form the recording bit sequence. Second is the modulation of the code words by the fundamental modulation methods, NRZ or NRZI (nonreturn to zero or nonreturn to zero inverse). If the m-bit data words are transformed to the n-bit code words using a prearranged lookup table or dictionary, the coding method is called block coding.

Several terms must be defined for an understanding of the coding scheme. The ratio of m/n is called the code rate. The bit interval of source data (T) is usually taken as a reference, so that each coded data rate is then normalized to the source data rate. The minimum and maximum time intervals between magnetic transitions are denoted by $T_{min}$ and $T_{max}$, respectively. The digital sum variation (DSV) is a running integral of the recording waveform. In computing DSV, the binary levels are assumed to be ±1. If the DSV of the code can grow indefinitely, the code has dc content which can't be recorded. If the DSV is bounded, the code is dc free. The code word digital sum (CDS) is the digital sum variation from the beginning to the end of a code word.

Since the number of bits in the code words of 8/9 NRZ is odd, it is impossible to have zero CDS code words. It is possible, however, to make the 8/9 NRZ dc free by constructing a one to two correspondence. First 512 ($2^9$) code words are divided into two groups of 256 code words each of which have opposite CDS polarities. Then, while observing the DSV of the coded sequence, the code words from the appropriate groups are selected to make the DSV bounded.

The problem with this coding scheme is that given arbitrary data, there is no unique sequence of bits to synchronize the reproduction process. One current synchronizing method uses a probabilistic process wherein the data is scrambled before the 8/9 coding and a fixed, unscrambled sequence of 9 bit bytes is chosen as the synchronizing pattern because it is unlikely to be reproduced as data. This pattern is then detected upon reproduction to provide the sync indication. Because there is at least the possibility of an input word being reproduced as a sync word, this method of generating a sync pattern is undesirable.

What is needed is a unique sync word pattern which can be detected regardless of the input data and which retains the dc-free nature of the code.

DISCLOSURE OF THE INVENTION

The above and other objects are attained by the present invention of an improved method and apparatus for 8/9 block coding in digital magnetic recording of the type wherein unscrambled 8 bit data words are mapped into 9 bit data words such that for any stream of 8 bit data words the resulting 9 bit data word stream will have on a short term average an equal number of 1's and 0's, wherein the improvement comprises selectively outputting a first and a second 9 bit code word that uniquely identify a synchronization point in the 9 bit data word stream. The first code word is 1 1111 1111$_2$ (1FF$_{16}$) if the digital sum variation (DSV) is less than zero and 0 0000 0000$_2$ (000$_{16}$) if the digital sum variation is greater than or equal to zero. The second code word is any ±1 CDS entry of the same CDS polarity as the first word. In a referred mbodiment of the invention the second code word is 1 0101 0101$_2$ or 155$_{16}$ (CDS=+1) or 0 1010 1010$_2$ or 0AA$_{16}$ (CDS=−1).

These code words have the advantages that (a) the maximum DSV is minimized, (b) the dc-free nature of the code is retained, (c) the run length is limited, (d) bit clock synchronizing transitions are provided, and (e) the code word sequence can not be duplicated by input data.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIG. 1 is a block diagram of an 8/9 NRZ encoder and decoder according to the invention; and FIG. 2 is a recording waveform of a dc-free 8/9 NRZ code.

BEST MODE OF CARRYING OUT THE INVENTION

Referring now more particularly to FIG. 1, because magnetic recording can not reproduce direct current (dc), it is necessary when doing digital recording to generate from a random input stream of 1's and 0's an output stream that has balanced numbers of 1's and 0's. This is accomplished by taking 8 bit data input words and assigning one of two 9 bit code output symbols for each input word. That is, for each 8 bit input word there are two unique 9 bit code words and one of the 9 bit code words is selected to represent the input word. One of the two 9 bit code words has a greater number of 1's and the other has a greater number of 0's. Which of the two 9 bit code words is to be selected is determined by keeping a running count of the variance (i.e. the DSV) of the 9 bit code word stream from an even number of output 1's and 0's. The appropriate 9 bit code word is selected to keep this number in balance.

An example of the recording waveform is shown in FIG. 2. In NRZ encoding, 1's and 0's in the code words are recorded as positive and negative levels; therefore, transitions occur only when the data bits change.

Input data in the form of 8 bit data words are received on line 10 and are supplied to code word lookup table 12 and code word digital sum (CDS) lookup table 14. For each input data word, the output of the code word lookup table 12 is one of two predetermined, corresponding 9 bit code words which has been selected to keep the dc content of the coding deterministically zero. The choice of which code word to select is controlled by a sign bit control signal from a digital sum variation register 24, as will be explained further herein. The selected 9 bit code word is output through DATA/SYNC multiplexer 16 to a parallel to serial converter 18.

For each input data word, the CDS lookup table 14 determines, at the data word rate, the digital sum variation form the beginning to the end of the code word which will be selected by the code word lookup table 12. The CDS lookup table 14 is also supplied with the sign bit control signal 28. The CDS lookup table 14 then outputs the code word digital sum (CDS) to a multiplexer 20 which, in turn, outputs the CDS to the first adding input of an adder 22.

The output of the adder 22 is supplied to a DSV register 24. The current count in the DSV register 24 is supplied to a second adding input of the adder 22. The sign of the count in the DSV register becomes the sign bit control signal 28. The code word lookup table 12 and the CDS lookup table 14 choose a code word whose CDS is opposite in polarity to the polarity of the sign bit control signal 28.

In order to insert a unique bit sequence into the output 9 bit code word stream for purposes of synchronization, a sync lookup table 26, in response to an input sync pulse 30 from an external source, not shown, selects a pair of 9 bit code words as determined by the sign bit control signal 28. The first 9 bit code word of the pair is either 1 1111 1111$_2$ (1FF$_{16}$) if the sign bit signal 28 is negative and 0 0000 0000$_2$ (000$_{16}$) if it is positive. The second 9 bit code word is any ±1 CDS entry of the same CDS polarity as the first 9 bit code word of the pair, which is a guaranteed illegal encoding for purposes of decoding, i.e. it is easily detected upon decoding as a sync signal and not as an input data word. Possibly, such second 9 bit words are 1 0101 0101$_2$ or 155$_{16}$ (CDS = +1) or 0 1010 1010$_2$ or 0AA$_{16}$ (CDS = −1).

This sync code word pair is output to the DATA/SYNC multiplexer 16. Additionally a control signal 32 from the sync lookup table 26 is supplied to control the selection of the signal to be output by the two multiplexers 16 and 20. When the sync control signal 32 commands it, the multiplexer 16 outputs the sync code word pair to the parallel to serial converter 18 which outputs dc free NRZ encoded data.

The CDS of the sync code word pair is output to the CDS/SYNC multiplexer 20. Upon receipt of the sync control signal 32, the CDS of the sync code word pair is supplied from the multiplexer 20 to the first adding input of the adder 22. The DSV is then determined in the same manner as described above with respect to the CDS from the CDS lookup table 14.

Although the present invention has been shown and described with respect to preferred embodiments, various changes and modifications which are obvious to a person skilled in the art to which the invention pertains are deemed to lie within the spirit and scope of the invention.

What is claimed is:

1. Apparatus for encoding 8 bit digital data input words into 9 bit digital data output words comprising:
   (a) code word lookup table means for storing a plurality of pairs of 9 bit code words, one code word of each pair having a positive code word digital sum (CDS) and the other code word of the pair having a negative CDS, and wherein the code word lookup table means is supplied with each input 8 bit data word and selectively outputs one of two 9 bit code words uniquely assigned to each input data word in response to a sign bit control signal;
   (b) CDS lookup table means supplied with each input data word for outputting the CDS of the code word assinged to that input data word by the code word lookup table means in response to a sign bit control signal;
   (c) synchronizing code pattern lookup table means for receiving a sync pulse from an external source, selecting one of two 18 bit sync code patterns in response thereto which can be not duplicated by the code word lookup table means, the selection of the sync code word being controlled by a sign bit control signal, and separately outputting the selected code pattern in two 9 bit bytes, the CDS of each of said sync code 9 bit bytes, and a sync select signal;
   (d) first multiplexing means supplied with the output of the code word lookup table means and the two sync code 9 bit bytes output from the synchronizing code pattern lookup table means for selecting and outputting as 9 bit digital data, in response to the sync select signal, one of said supplied signals;
   (e) second multiplexing means supplied with the CDS output of the CDS lookup table means and the CDS output of the synchronizing code pattern lookup table means for selecting and outputting, in response to the snyc select signal, one of said supplied signals;
   (f) adder means having two inputs, for outputting the sum of the signals supplied to these two inputs, one of the two inputs being supplied with the output of the second mulitplexing means;
   (g) digital sum variation register means for storing the output of the adder means and wherein the count in the digital sum variation register means represents the digital sum variation, this count is supplied as the other input to the adder menas, and the sign of said count is outputted as a sign bit control signal to the code word lookup table means, the CDS lookup table means, and the synchronizing code pattern lookup table means.

2. Apparatus as recited in claim 1 for encoding 8 bit digital data input words into 9 bit digital data output words wherein the synchronizing code pattern lookup table means selects as the first synchronizing 9 bit byte the word 1 1111 1111$_2$ or 1FF$_{16}$ if the sign bit control signal indicates that the digital sum variation (DSV) is less than zero and 0 0000 0000$_2$ or 000$_{16}$ if the digital sum variation is greater than or equal to zero.

3. Apparatus as recited in claim 2 for encoding 8 bit digital data input words into 9 bit digital data output words wherein the synchronizing code pattern lookup table means selects as the second synchronizing 9 bit byte any ±1 CDS entry of the same CDS polarity as the first synchronizing 9 bit byte.

4. Apparatus as recited in claim 3 for encoding 8 bit digital data input words into 9 bit digital data output words wherein the synchronizing code pattern lookup table means selects as the second synchronizing 9 bit byte either 1 0101 0101$_2$ or 155$_{16}$ (CDS= +1) or 0 1010 1010$_2$ or 0AA$_{16}$ (CDS= −1).

5. Apparatus as recited in claim 1 for encoding 8 bit digital data input words into 9 bit digital data output words wherein the code word lookup table means, in response to the sign bit control signal, selects the 9 bit code word having a CDS which is opposite in polarity to the polarity of the sign bit control signal.

6. A method for encoding 8 bit digital data input words into 9 bit digital data output words comprising the following steps:
  (a) storing in a code word lookup table a plurality of pairs of 9 bit code words, one code word of each pair having a positive code word digital sum (CDS) and the other code word of the pair having a negative CDS, inputting each 8 bit digital data word to the code word lookup table and selectively outputting one of two 9 bit code words uniquely assigned to each 8 bit digital data input data word in response to a sign bit control signal;
  (b) inputting each 8 bit digital data word into a CDS lookup table and outputting the CDS of the code word assigned to that input data word by the code word lookup table means in response to a sign bit control signal;
  (c) receiving a sync pulse from an external source, selecting one of two 18 bit sync code patterns in response thereto which can be not duplicated by the code word lookup table means, the selection of the sync code word being controlled by a sign bit control signal, and separately outputting the selected code pattern in two 9 bit bytes, the CDS of each of said sync code 9 bit bytes, and a sync select signal;
  (d) multiplexing the 9 bit code word derived from the code word lookup table and the selected synchronizing code pattern and selecting and outputting as 9 bit digital data, in response to the sync select signal, either the 9 bit code word or the synchronizing code pattern;
  (e) multiplexing the CDS of the 9 bit code word and the CDS of the synchronizing code pattern and selecting and outputting one of them in response to the sync select signal;
  (f) determining the digital sum variation of the output of the CDS multiplexing step, determining its sign, and outputting the sign of the digital sum variation as a sign bit control signal for use in the steps of outputting the code word from the code word lookup table, the CDS from the CDS lookup table, and the synchronizing code pattern from the synchronizing code pattern lookup table.

7. The method as recited in claim 6 for encoding 8 bit digital data input words into 9 bit digital data output words wherein the step of selecting the synchronizing code pattern from the synchronizing code pattern lookup table comprises selecting as the first synchronizing 9 bit byte the word 1 1111 1111$_2$ or 1FF$_{16}$ if sign bit control signal indicates that the digital sum variation (DSV) is less than zero and 0 0000 0000$_2$ or 000$_{16}$ if the digital sum variation is greater than or equal to zero.

8. The method as recited in claim 6 for encoding 8 bit digital data input words into 9 bit digital data output words wherein the step of selecting the synchronizing code pattern from the synchronizing code pattern lookup table comprises selecting as the second synchronizing 9 bit byte any ±1 CDS entry of the same CDS polarity as the first word.

9. Method as recited in claim 7 for encoding 8 bit digital data input words into 9 bit digital data output words wherein the step of selecting the synchronizing code pattern from the synchronizing code pattern lookup table comprises selecting as the second synchronizing 9 bit byte either 1 0101 0101$_2$ or 155$_{16}$ (CDS= +1) or 0 1010 1010$_2$ or 0AA$_{16}$ (CDS= −1).

10. The method as recited in claim 6 for encoding 8 bit digital data input words into 9 bit digital daa output words wherein the step of selectively outputting one of two 9 bit code words from the code word lookup table in response to a sign bit control signal comprises outputting the 9 bit code word whose CDS is opposite in polarity to the polarity of the sign bit control signal.

* * * * *